(12) United States Patent
Nishiyama

(10) Patent No.: US 8,852,977 B2
(45) Date of Patent: Oct. 7, 2014

(54) METHOD FOR PRODUCING LIGHT-EMITTING ELEMENTS

(71) Applicant: Panasonic Corporation, Osaka (JP)

(72) Inventor: Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 124 days.

(21) Appl. No.: 13/739,290

(22) Filed: Jan. 11, 2013

(65) Prior Publication Data

US 2013/0143346 A1    Jun. 6, 2013

Related U.S. Application Data

(63) Continuation of application No. PCT/JP2010/004955, filed on Aug. 6, 2010.

(51) Int. Cl.
*H01L 21/00* (2006.01)
*H01L 51/52* (2006.01)
*H01L 51/50* (2006.01)
*H05B 33/10* (2006.01)
*H01L 27/32* (2006.01)

(52) U.S. Cl.
CPC ......... *H01L 51/5203* (2013.01); *H01L 27/3283* (2013.01); *H01L 51/5088* (2013.01); *H01L 27/3246* (2013.01); *H05B 33/10* (2013.01)
USPC .................... 438/34; 318/498; 257/E51.018

(58) Field of Classification Search
CPC ............ H01L 27/3283; H01L 27/3246; H01L 51/5088; H01L 33/08; H05B 33/10
USPC ....................... 438/34; 257/E51.018; 213/498
See application file for complete search history.

(56) References Cited

U.S. PATENT DOCUMENTS

| | | | |
|---|---|---|---|
| 5,294,869 | A | 3/1994 | Tang et al. |
| 5,443,922 | A | 8/1995 | Nishizaki et al. |
| 5,688,551 | A | 11/1997 | Littman et al. |
| 6,132,280 | A | 10/2000 | Tanabe et al. |
| 6,284,393 | B1 | 9/2001 | Hosokawa et al. |
| 6,309,801 | B1 | 10/2001 | Meijer et al. |

(Continued)

FOREIGN PATENT DOCUMENTS

| | | |
|---|---|---|
| DE | 102005007540 | 8/2006 |
| EP | 2175504 | 4/2010 |

(Continued)

OTHER PUBLICATIONS

Meyer et al., "Charge generation layers comprising transition metal-oxide/organic interfaces: Electronic structure and charge generation mechanism", Applied Physics Letters, 96, 193302, pp. 1-3 (May 2010).

(Continued)

*Primary Examiner* — Jarrett Stark
(74) *Attorney, Agent, or Firm* — Greenblum & Bernstein, P.L.C.

(57) ABSTRACT

A light-emitter is configured so that at least a hole injection layer and a light-emitting layer are laminated between a first electrode and a second electrode, and the light-emitting layer is formed in an area defined by a bank. In the area defined by the bank, the hole injection layer is formed so as to have a recess in an upper surface thereof. An upper peripheral edge of the recess is covered with a part of the bank. The light-emitting layer is formed with respect to the recess formed in the hole injection layer by a laser transfer method.

13 Claims, 14 Drawing Sheets

(56) References Cited

U.S. PATENT DOCUMENTS

| | | |
|---|---|---|
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0093432 A1 | 5/2005 | Yamazaki et al. |
| 2005/0093434 A1 | 5/2005 | Suh et al. |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0139342 A1 | 6/2006 | Yu |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0099396 A1 | 5/2007 | Hirai et al. |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0150422 A1 | 6/2008 | Ohara |
| 2008/0231179 A1 | 9/2008 | Abe et al. |
| 2009/0058268 A1 | 3/2009 | Yoshida et al. |
| 2009/0096364 A1 | 4/2009 | Fujii et al. |
| 2009/0115318 A1 | 5/2009 | Gregory et al. |
| 2009/0160325 A1 | 6/2009 | Yatsunami et al. |
| 2009/0206422 A1 | 8/2009 | Illing et al. |
| 2009/0224664 A1 | 9/2009 | Yoshida et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2009/0284146 A1 | 11/2009 | Yoshida et al. |
| 2010/0084672 A1 | 4/2010 | Ueno et al. |
| 2010/0102310 A1 | 4/2010 | Komatsu et al. |
| 2010/0181554 A1 | 7/2010 | Yoshida et al. |
| 2010/0188376 A1 | 7/2010 | Sagawa et al. |
| 2010/0213827 A1 | 8/2010 | Yoshida et al. |
| 2010/0252857 A1 | 10/2010 | Nakatani et al. |
| 2010/0258833 A1 | 10/2010 | Okumoto et al. |
| 2010/0302221 A1 | 12/2010 | Okumoto |
| 2011/0018007 A1 | 1/2011 | Kasahara et al. |
| 2011/0037065 A1 | 2/2011 | Ueno et al. |
| 2011/0037068 A1 | 2/2011 | Yamazaki et al. |
| 2011/0042703 A1 | 2/2011 | Okumoto et al. |
| 2011/0140596 A1 | 6/2011 | Yoshida et al. |
| 2011/0180821 A1 | 7/2011 | Matsushima |
| 2011/0193107 A1 | 8/2011 | Takeuchi et al. |
| 2011/0198623 A1 | 8/2011 | Matsushima |
| 2011/0198624 A1 | 8/2011 | Matsushima |
| 2011/0204410 A1 | 8/2011 | Yada |
| 2012/0061656 A1 | 3/2012 | Ohuchi et al. |
| 2012/0178191 A1 | 7/2012 | Sakanoue et al. |

FOREIGN PATENT DOCUMENTS

| | | |
|---|---|---|
| EP | 2270896 | 1/2011 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-220656 | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-218250 | 9/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-009746 | 1/2010 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2007/037358 | 4/2007 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

Ramana et al., "Electron microscopy investigation of structural transformation in tungsten oxide (WO3) thin films", Physica Status Solidi (a) 202, No. 10, pp. R108-R110 (Jul. 6, 2005).

Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).

(56) References Cited

OTHER PUBLICATIONS

United States Office Action in U.S. Appl. No. 13/746,481, dated Apr. 29, 2014.
United States Office Action in U.S. Appl. No. 13/740,348, dated Apr. 29, 2014.
United States Action in U.S. Appl. No. 13/205,773, dated Aug. 16, 2013.
United States Office Action in U.S. Appl. No. 13/205,773, dated Jan. 10, 2013.
Extended European Search Report (EESR) in European Patent Application No. 10741076.3, dated Feb. 25, 2013.
United States Office Action in U.S. Appl. No. 13/205,773, dated Mar. 6, 2013.
United States Advisory Action in U.S. Appl. No. 13/205,773, dated Jan. 15, 2014.
United States Office Action in U.S. Appl. No. 13/205,773, dated Feb. 28, 2014.
Tungsten Oxide, McGraw-Hill Dictionary of Scientific and Technical Terms, McGraw-Hill Book Company, Fourth Edition, p. 1979, left column, date stamped Feb. 28, 1989.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,773 to Seiji Nishiyama, filed Aug. 9, 2011.
U.S. Appl. No. 13/739,363 to Seiji Nishiyama et al., filed Jan. 11, 2013.
U.S. Appl. No. 13/736,285 to Seiji Nishiyama et al., filed Jan. 8, 2013.
U.S. Appl. No. 13/740,348 to Seiji Nishiyama et al., filed Jan. 14, 2013.
U.S. Appl. No. 13/740,353 to Seiji Nishiyama et al., filed Jan. 14, 2013.
U.S. Appl. No. 13/746,481 to Seiji Nishiyama, filed Jan. 22, 2013.
International Search Report in PCT/JP2010/000782, dated Apr. 6, 2010.
International Search Report in PCT/JP2010/004987, dated Sep. 7, 2010.
International Search Report in PCT/JP2010/004959, dated Nov. 9, 2010.
International Search Report in PCT/JP2010/004985, dated Nov. 16, 2010.
International Search Report in PCT/JP2010/004962, dated Sep. 7, 2010.
International Search Report in PCT/JP2010/004955, dated Sep. 7, 2010.
International Search Report in PCT/JP2010/004986, dated Aug. 31, 2010.

METHOD FOR PRODUCING LIGHT-EMITTING ELEMENTS

CROSS REFERENCE TO RELATED APPLICATION

This is a continuation application of PCT Application No. PCT/JP2010/004955 filed Aug. 6, 2010, designating the United States of America, the disclosure of which, including the specification, drawings and claims, is incorporated herein by reference in its entirety.

TECHNICAL FIELD

The present disclosure relates to a method for manufacturing a light-emitter.

DESCRIPTION OF THE RELATED ART

In recent years, progress has been made in research and development of an organic electroluminescence element (hereinafter, referred to as an "organic EL element"). The organic EL element is a light-emitter that uses the phenomenon of electroluminescence occurring in organic material). The organic EL element has a structure in which a light-emitting layer is interposed between a first electrode (anode) and a second electrode (cathode). A bank made from an insulating material is formed laterally along the light-emitting layer, and defines a shape of the light-emitting layer. Between the first electrode and the light-emitting layer, a hole injection layer, a hole transport layer, or a hole injection transport layer, for example, is interposed, as necessary. Between the second electrode and the light-emitting layer, an electron injection layer, an electron transport layer, or an electron injection transport layer is interposed, as necessary. Hereinafter, the hole injection layer, the hole transport layer, the hole injection transport layer, the electron injection layer, the electron transport layer, and the electron injection transport layer are collectively referred to as a "charge injection transport layer".

Although the charge injection transport layer of a conventional organic EL element is formed using a conductive polymer material such as PEDOT (a mixture of polythiophene and polystyrene sulfonate), use of the charge injection transport layer formed using a metal compound such as a transition metal oxide has been proposed (see Patent Literature 1, for example). The metal compound has a better voltage-current density property than the PEDOT, and is considered to be less likely to deteriorate when high current is applied to increase luminescence intensity. The metal compound is therefore expected to be used for the charge injection transport layer.

CITATION LIST

Patent Literature

[Patent Literature 1]
Japanese Patent Application Publication No. 2005-203339
[Patent Literature 2]
Japanese Patent Application Publication No. 2006-344459

SUMMARY

It is also necessary to improve a luminescence property of an organic EL element having the above-mentioned structure in which the metal compound is applied to the charge injection transport layer.

One non-limiting and exemplary embodiment provides a method for manufacturing a light-emitter having a favorable luminescence property.

In one general aspect, the techniques disclosed here feature a method for manufacturing a light-emitter including a first electrode, a laminate disposed on the first electrode that includes a charge injection transport layer and a light-emitting layer, a second electrode disposed on the laminate, and a bank that defines an area in which the light-emitting layer is to be formed, the method comprising: forming the charge injection transport layer; forming a bank material layer that forms the bank on the charge injection transport layer; removing a portion of the bank material layer to partially expose the charge injection transport layer; heat-treating a remaining portion of the bank material layer; and forming the light-emitting layer on an exposed surface of the charge injection transport layer after the heat treatment, wherein the charge injection transport layer is made from a material that is eroded when exposed to a liquid used while the charge injection transport layer is partially exposed, the charge injection transport layer having a recess in the exposed surface thereof so that a bottom of the recess is lower than a bottom surface of the remaining portion of the bank material layer, the recess being formed by the exposed surface eroded by the liquid, the remaining portion of the bank material layer being made fluid so that the bank material layer extends to cover an upper peripheral edge of the recess, the light-emitting layer being formed by using a laser transfer method.

With the above-mentioned structure, since the upper peripheral edge of the recess formed in the charge injection transport layer is covered with the part of the bank, the electrical field concentration in the vicinity of the upper peripheral edge of the recess is suppressed when the light-emitter emits light. As a result, localized flow of current to the light-emitting layer is suppressed. An occurrence of uneven luminance in a light-emitting surface is therefore suppressed, and the luminescence property is further improved.

These general and specific aspects may be implemented using a light-emitter.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

DETAILED DESCRIPTION

Technical Problem of Conventional Art

Regarding the organic EL element to which the metal compound is applied as described in the section of Description of the Related Art, the inventor found, through an intense study, that the uneven luminance can occur in the light-emitting surface and a life of the organic EL element can be reduced due to localized deterioration of the light-emitting layer.

After further studying these problems, the inventor gained the following knowledge.

Figure 1A:
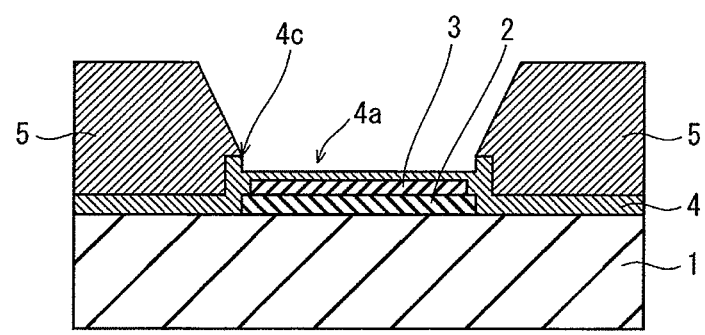
FIGS. 1A and 1B each show an end elevation to illustrate a technical problem of the conventional art.
Figure 1B:
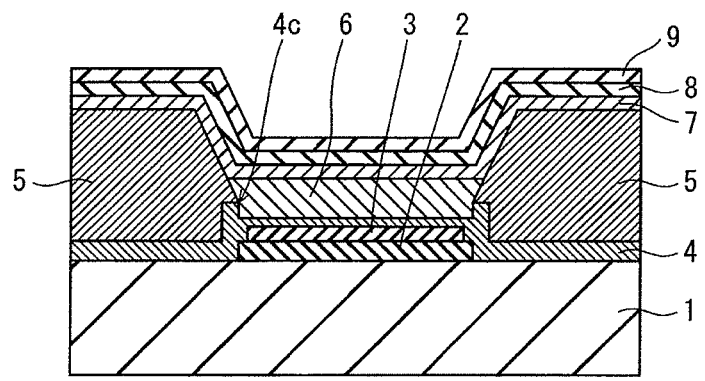

FIGS. 1A and 1B are each an end elevation showing a manufacturing process of an organic EL display. FIG. 1A shows a status in which a first electrode 2, an ITO layer 3, a hole injection layer 4, and a bank 5 are formed on a TFT substrate 1. FIG. 1B shows a status in which a light-emitting layer 6, an electron injection layer 7, a second electrode 8, and a passivation layer 9 are further formed.

According to the structure in which the metal compound is applied to the charge injection transport layer (the hole injection layer 4 in this example), a recess 4a is formed in an upper surface of the hole injection layer 4 (see FIG. 1A) in a process of forming the bank 5. If the light-emitting layer 6 is formed with the recess 4a formed in the upper surface of the hole injection layer 4 (see FIG. 1B), an electric field concentrates in the vicinity of an upper peripheral edge 4c of the recess 4a when the organic EL display emits light. As a result, localized flow of current to the light-emitting layer 6 can occur. This might lead to the occurrence of uneven luminance in a light-emitting surface and reduce a life of the organic EL element due to localized deterioration of the light-emitting layer.

The above-described problems and knowledge are unique to an organic EL element to which a metal compound is applied, and have technical significance in terms of not having been revealed.

As described above, the inventor arrived at the following technical features through a series of research and studies. That is, by covering the upper peripheral edge of the recess formed in the upper surface of the charge injection transport layer with a part of the bank, concentration of charges in the vicinity of the upper peripheral edge of the recess is suppressed when an organic EL element emits light. As a result, localized flow of current to the light-emitting layer is suppressed.

<Outline of One Aspect of Present Disclosure>

In one general aspect, the techniques disclosed here feature a method for manufacturing a light-emitter including a first electrode, a laminate disposed on the first electrode that includes a charge injection transport layer and a light-emitting layer, a second electrode disposed on the laminate, and a bank that defines an area in which the light-emitting layer is to be formed, the method comprising: forming the charge injection transport layer; forming a bank material layer that forms the bank on the charge injection transport layer; removing a portion of the bank material layer to partially expose the charge injection transport layer; heat-treating a remaining portion of the bank material layer; and forming the light-emitting layer on an exposed surface of the charge injection transport layer after the heat treatment, wherein the charge injection transport layer is made from a material that is eroded when exposed to a liquid used while the charge injection transport layer is partially exposed, the charge injection transport layer having a recess in the exposed surface thereof so that a bottom of the recess is lower than a bottom surface of the remaining portion of the bank material layer, the recess being formed by the exposed surface eroded by the liquid, the remaining portion of the bank material layer being made fluid so that the bank material layer extends to cover an upper peripheral edge of the recess, the light-emitting layer being formed by using a laser transfer method.

With the above manufacturing method, since the upper peripheral edge of the recess formed in the charge injection transport layer is covered with the part of the bank, the electrical field concentration in the vicinity of the upper peripheral edge of the recess is suppressed when the light-emitter emits light. As a result, localized flow of current to the light-emitting layer is suppressed. An occurrence of uneven luminance in a light-emitting surface is therefore suppressed, and the luminescence property is further improved.

The charge injection transport layer may be a hole injection layer made from one of a metal oxide, a metal nitride, and a metal oxynitride. In general, these are hydrophilic materials. The recess is therefore formed in a washing process with pure water in the process of forming the bank.

A hole transport layer that transports holes from the hole injection layer to the light-emitting layer may be interposed between the hole injection layer and the light-emitting layer.

The charge injection transport layer may be made from a material that is eroded when exposed to a liquid used for forming the bank.

The liquid may be water or a TMAH solution. With this structure, the recess is formed in a process of forming a bank without adding extra steps.

The bank may be formed so that a part of the bank reaches a bottom of the recess and that a side surface of the bank slopes upward from the bottom of the recess to a top of the bank. With this structure, when the light-emitting layer is formed using printing technology such as inkjet technology, ink is distributed to every corner of an area defined by the bank. As a result, formation of a void and the like is suppressed.

The bank may be formed so that a part of the bank is out of contact with a bottom of the recess. In order to cover the upper peripheral edge of the recess with the part of the bank, it is considered that a bank material is heat-treated to make it fluid so that the upper peripheral edge of the recess is covered with a part of the bank material. With the above structure, the temperature and time of the heat treatment are reduced as it is not necessary to extend the bank material to the bottom of the recess.

The bank may be formed so as to include an insulating material. With this structure, adjacent light-emitting layers are insulated from each other.

The light-emitting layer may comprise an organic EL layer.

The charge injection transport layer may be formed so as to extend laterally along a bottom surface of the bank.

The upper peripheral edge of the recess may be formed so as to comprise a convex portion composed of (i) a part of the upper surface of the charge injection transport layer in which the recess is not formed, and (ii) an inner side surface of the recess.

In the forming the light-emitting layer, for each of a plurality of areas defined by the bank, a transfer substrate having a transfer layer of a corresponding color may be irradiated with a laser to sublimate and transfer the transfer layer onto the charge injection transport layer, thereby forming a plurality of light-emitting layers of different colors.

The forming the light-emitting layer may include the successive steps of: irradiating, with a laser, a first transfer substrate including a photothermal conversion layer and a first transfer layer of a first luminescent color laminated on the photothermal conversion layer, to sublimate and transfer the first transfer layer, thereby forming the light-emitting layer of the first luminescent color, and irradiating, with a laser, a second transfer substrate including the photothermal conversion layer and a second transfer layer of a second luminescent color laminated on the photothermal conversion layer, to sublimate and transfer the second transfer layer, thereby forming the light-emitting layer of the second luminescent color.

The following describes an embodiment of the present disclosure in detail, with reference to the drawings. In the present embodiment, an organic EL element using an organic EL material as a light-emitting layer is taken as an example of the light-emitter, and an organic EL display is taken as an example of the light-emitting device having a plurality of light-emitters. Note that the drawings are not to scale, so that proportions of members in the drawings are different from actual proportions.

<Configuration>

Figure 2:
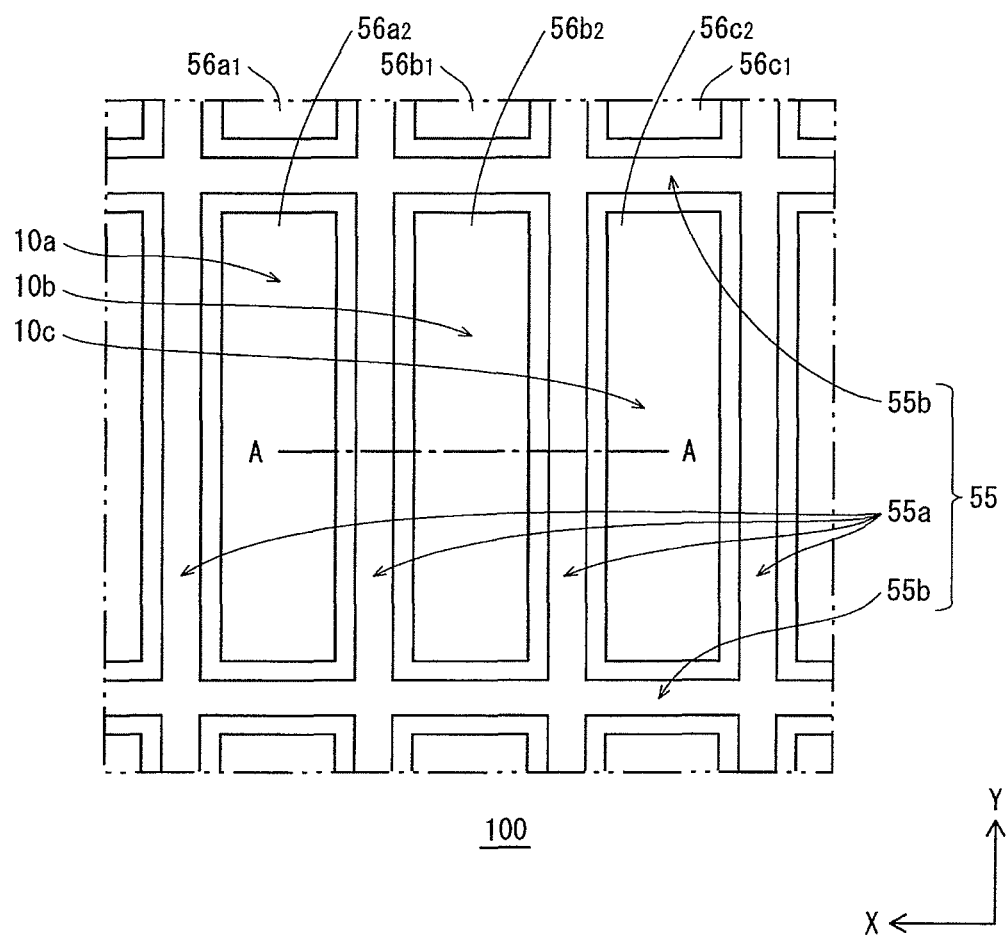
FIG. 2 is a plan view showing a part of an organic EL display according to an embodiment of the present disclosure.

FIG. 2 is a plan view showing a part of an organic EL display according to an embodiment of the present disclosure.

A organic EL display 100 is a top-emission type organic EL display composed of organic EL elements 10a, 10b, and 10c arranged in a matrix and each provided with a light emitting layer having a color of either red (R), green (G), or blue (B). Each organic EL element functions as a sub-pixel, and three consecutive organic EL elements of colors of RGB function as a pixel as a whole.

In an example of FIG. 2, a pixel bank 55 having a lattice shape is adopted. Each bank element 55a extending along a Y axis delimits consecutive light-emitting layers 56a1, 56b1, and 56c1 arranged along an X axis as well as consecutive light-emitting layers 56a2, 56b2, and 56c2 arranged along the X axis.

On the other hand, a bank element 55b extending along the X axis delimits adjacent light-emitting layers 56a1 and 56a2 arranged along the Y axis, adjacent light-emitting layers 56b1 and 56b2 arranged along the Y axis, and adjacent light-emitting layers 56c1 and 56c2 arranged along the Y axis.

Figure 3:
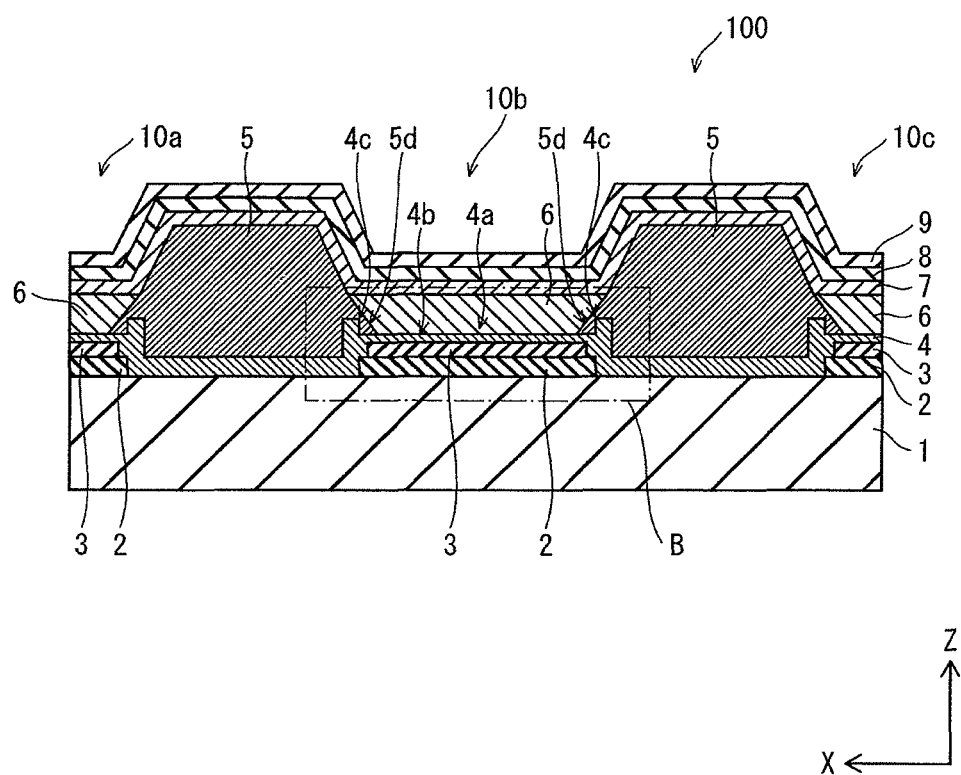
FIG. 3 is an end elevation schematically showing a cross section of the part of the organic EL display according to the embodiment of the present disclosure.
Figure 4:
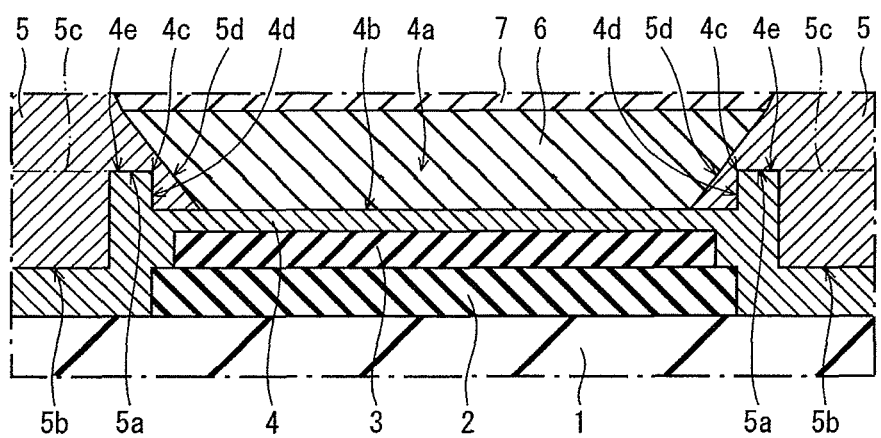
FIG. 4 is an enlarged end elevation of a portion B enclosed by an alternate long and short dash line of FIG. 3.

FIG. 3 is an end elevation schematically showing a cross section of a part of the organic EL display according to the embodiment of the present disclosure taken along the line A-A of FIG. 2. FIG. 4 is an enlarged end elevation of a portion B enclosed by an alternate long and short dash line of FIG. 3.

On the TFT substrate 1 (hereinafter, simply referred to as a "substrate 1"), the first electrodes (anodes) 2 are formed in a matrix. On the first electrode 2, the ITO (indium tin oxide) layer 3 and the hole injection layer 4 are laminated in the stated order. Note that, while the ITO layer 3 is laminated only on the first electrode 2, the hole injection layer 4 is formed not only on the first electrode 2 but also over the substrate 1.

The bank 5 is formed above a periphery of the first electrode 2 via the hole injection layer 4. The light-emitting layer 6 is laminated in an area defined by the bank 5. On the light-emitting layer 6, the electron injection layer 7, the second electrode (cathode) 8, and the passivation layer 9 are formed continuously across the consecutive organic EL elements 10a, 10b and 10c, passing over the bank 5.

<Structure of Each Component>

The substrate 1 is made from an insulating material such as alkali-free glass, soda glass, nonluminescent glass, phosphate glass, boric-acid glass, quartz, acrylic resin, styrene resin, polycarbonate resin, epoxy resin, polyethylene, polyester, silicon resin, and alumina.

The first electrode 2 is made of Ag (silver). Note that the first electrode 2 may be made of APC (alloy of silver, palladium and copper), ARA (alloy of silver, rubidium and gold), MoCr (alloy of molybdenum and chrome) or NiCr (alloy of nickel and chrome), for example. When the organic EL display 100 is a top-emission type display, it is desirable that the first electrode 2 be made of a light-reflective material.

The ITO layer 3 is interposed between the first electrode 2 and the hole injection layer 4, and has a function of improving the bond between these layers.

The hole injection layer 4 is made from WOx (tungsten oxide) or MoxWyOz (molybdenum-tungsten oxide). Note that the hole injection layer 4 only has to be made from a metal compound performing a function of injecting holes. Examples of such a metal compound are a metal oxide, a metal nitride, and a metal oxynitride.

When the hole injection layer 4 is made from a specific metal compound, it is easy to inject holes, and electrons contribute to light emission effectively in the light-emitting layer 6. Favorable luminescence property is therefore obtained. It is desirable that the specific metal compound be a transition metal. The oxidization number of a transition metal is plural, and therefore the transition metal can have a plurality of levels. As a result, it becomes easy to inject holes, and thus drive voltage is reduced.

As shown in FIG. 4, the hole injection layer 4 extends laterally along bottom surfaces 5a and 5b of the bank 5, and has a recess 4a in an upper surface thereof. A bottom 4b of the recess 4a is lower than a level 5c of the bottom surface 5a of the bank 5. The recess 4a is made up of the bottom 4b and an inner side surface 4d continuing the bottom 4b. The depth of the recess 4a is approximately 5 nm to 30 nm. An upper peripheral edge 4c of the recess is a convex portion composed of (i) a part of the upper surface of the hole injection layer 4 in which the recess is not formed 4e and (ii) the inner side surface 4d of the recess. The upper peripheral edge 4c is covered with a covering part 5d, which is a part of the bank 5.

The upper peripheral edge 4c of the recess protrudes from the bottom 4b of the recess. Therefore, if the upper peripheral edge 4c is not covered with the covering part 5d made from an insulating material, electric field concentrates in the vicinity of the upper peripheral edge 4c of the recess, and localized flow of current to the light-emitting layer 6 occurs. As a result, the uneven luminance occurs in a light-emitting surface and a life of the organic EL element is reduced due to localized deterioration of the light-emitting layer 6. In the present embodiment, however, the above-mentioned problems are prevented, because the upper peripheral edge 4c of the recess is covered with the covering part 5d made from an insulating material. Note that it is desirable that the thickness of the covering part 5d (a shortest distance between the upper peripheral edge 4c of the recess and the light-emitting layer 6) be 2 nm to 5 nm to effectively suppress the electric field concentration.

In an example of FIG. 4, the upper peripheral edge 4c of the recess has a right angle. The upper peripheral edge 4c of the recess, however, may have a plurality of angles, or may be curved. In such a case, the electrical field concentration is further suppressed.

In the present embodiment, the covering part 5d reaches the bottom 4b of the recess 4a, and a side surface of the bank 5 slopes upward from the bottom 4b of the recess to a top of the bank 5. With this structure, when the light-emitting layer 6 is formed using printing technology such as inkjet technology, ink is distributed to every corner of an area defined by the bank. As a result, formation of a void and the like is suppressed.

The bank 5 partitions the light-emitting layer 6 into sub-pixels. The bank 5 is made from an organic material, such as a resin, and has an insulating property. Examples of the organic material are an acrylic resin, a polyimide resin and a novolac-type phenolic resin. It is desirable that the bank 5 be resistant to organic solvent. Furthermore, the bank 5 can be subjected to an etching process, a baking process or the like. Therefore, it is desirable that the bank 5 be made from a highly resistant material so as not to be excessively deformed or degenerated by such processes.

The light-emitting layer 6 constitutes a functional layer. It is desirable that the light-emitting layer 6 be made from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

The electron injection layer 7 has a function of transporting, to the light-emitting layer 6, an electron injected from the second electrode 8. It is desirable that the electron injection layer 7 be made from barium, phthalocyanine, fluorine lithium, or a combination of these materials.

The second electrode 8 is made of ITO, or IZO (indium zinc oxide), for example. When the organic EL display 100 is a top-emission type display, it is desirable that the second electrode 8 be made of a light-transmissive material.

The passivation layer 9 has a function of preventing the light-emitting layer 6 and so on from being exposed to moisture and air. The passivation layer 9 is made from a material such as SiN (silicon nitride) and SiON (silicon oxynitride). When the organic EL display 100 is a top-emission type display, it is desirable that the passivation layer 9 be made of a light-transmissive material.

<Manufacturing Method>

FIGS. 5A, 5B, 5C, 6A, 6B, 6C, 7, 8A, 8B, 9A, 9B, and 9C are each a process chart showing a method for manufacturing the organic EL display according to the embodiment of the present disclosure.

Figure 5A:
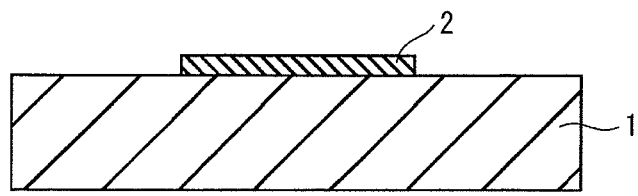
FIGS. 5A, 5B, and 5C are each a process chart showing a method for manufacturing the organic EL display according to the embodiment of the present disclosure.

At first, as shown in FIG. 5A, a thin Ag film is formed on the substrate 1 using a sputtering method. The formed thin Ag film is then patterned using photolithography or the like to form the first electrodes 2 in a matrix. Note that the thin Ag film may be formed using a vacuum evaporation method or the like.

Figure 5B:
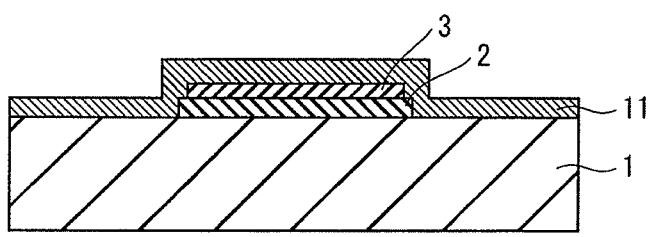

Next, as shown in FIG. 5B, a thin ITO film is formed using the sputtering method or the like. The formed thin ITO film is then patterned using the photolithography or the like to form the ITO layer 3. Then, a thin WOx film 11 or a thin MoxWyOz film 11 is formed from a composition containing WOx or MoxWyOz using technology such as vacuum evaporation and sputtering.

Figure 5C:
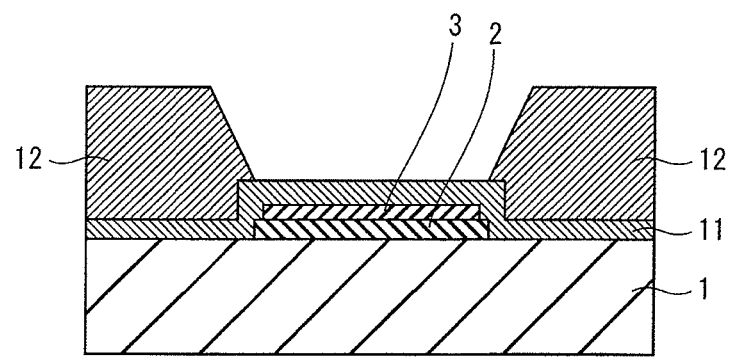

Next, as shown in FIG. 5C, a bank material layer 12 is formed on the thin film 11 using a bank material including an organic material. A portion of the bank material layer 12 is removed so that the thin film 11 is partially exposed. The bank material layer 12 is formed by application or the like. The portion of the bank material layer 12 is removed by performing patterning using predetermined developer (e.g. a tetramethylammonium hydroxide (TMAH) solution).

Figure 6A:
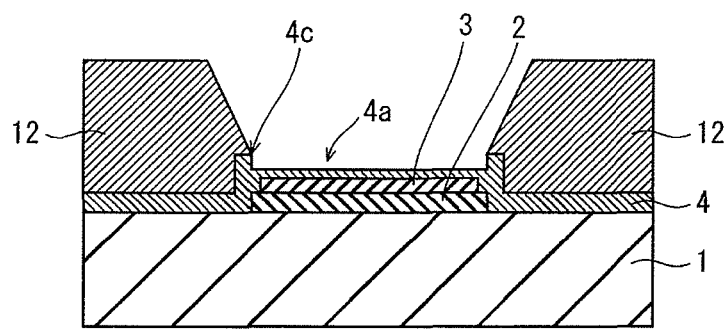
FIGS. 6A, 6B, and 6C are each a process chart showing a method for manufacturing the organic EL display according to the embodiment of the present disclosure.

Since WOx or MoxWyOz, which is a material for the thin film 11, is soluble in pure water and a TMAH solution, bank residues attached to a surface of the thin film 11 are removed by being washed using the developer, and, as shown in FIG. 6A, an exposed portion of the thin film 11 is eroded to form a recess. As a result, the hole injection layer 4 having the recess 4a is formed.

Figure 6B:
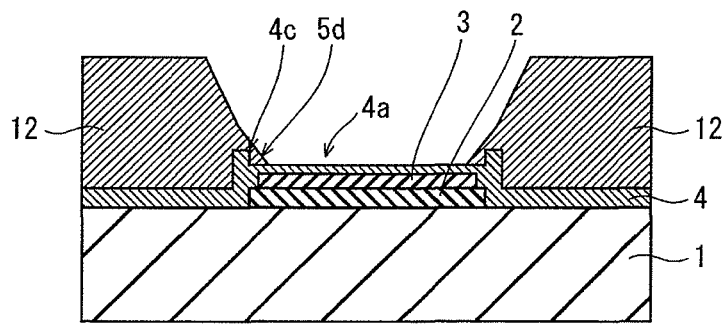

Next, as shown in FIG. 6B, a remaining portion of the bank material layer 12 is made fluid to some extent by heat treatment so that a bank material extends to cover the upper peripheral edge 4c of the recess. The upper peripheral edge 4c of the recess is covered with the covering part 5d in the above-mentioned manner. A heat cure can be adopted as the heat treatment, for example. The temperature and time for the heat cure may be appropriately determined in consideration of a type of the bank material and a required thickness of the covering part 5d and so on. After that, a surface of the remaining portion of the bank material layer 12 is, for example, subjected to treatment using fluorine plasma and the like to provide liquid repellency as necessary, and, as a result, the bank 5 is formed.

Figure 6C:
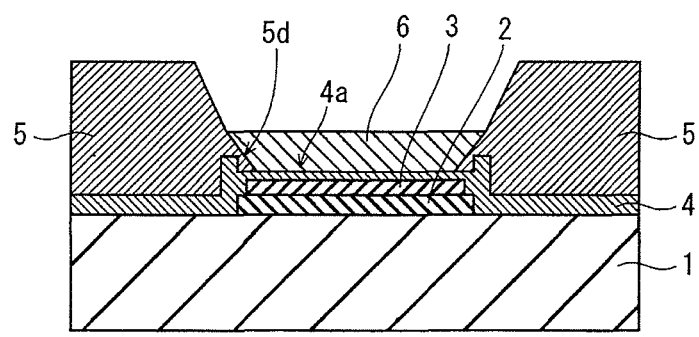
Figure 7:
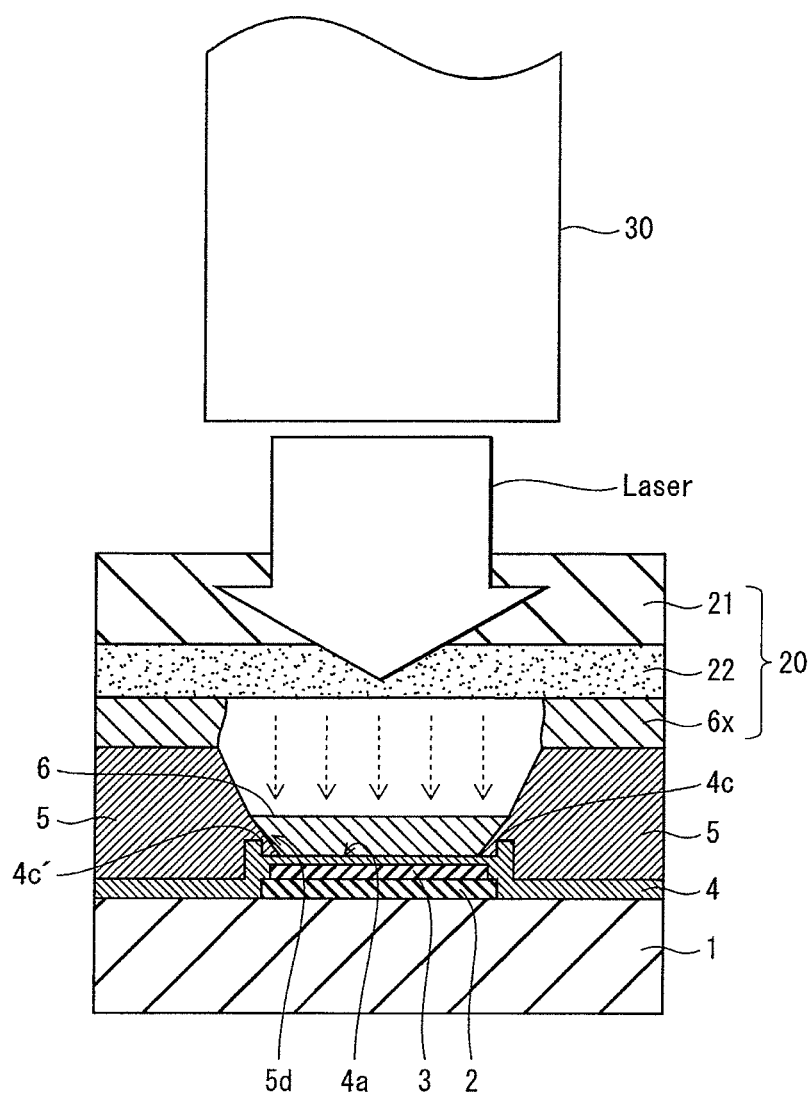
FIG. 7 illustrates a process of forming a light-emitting layer by a laser transfer method.

As shown in FIG. 6C, in an area defined by the bank 5, the light-emitting layer 6 is then formed on the recess 4a formed in the hole injection layer 4. In the process of forming the light-emitting layer, a laser transfer method is used, for example. FIG. 7 is a sectional view illustrating the process of forming the light-emitting layer by the laser transfer method.

As illustrated in FIG. 7, in the laser transfer method, a donor substrate 20 is disposed on the substrate on which the bank 5 has been formed. The donor substrate 20 includes a transparent substrate (glass substrate 21), and a metal layer (photothermal conversion layer 22) and a transfer layer 6X, both of which are uniformly laminated on the transparent substrate in the stated order.

The photothermal conversion layer 22 adhesively holds the transfer layer 6X before use. When irradiated with a laser, the photothermal conversion layer 22 converts energy of a laser light into heat so as to heat and sublimate the transfer layer 6X. Specifically, the photothermal conversion layer 22 is a film having a thickness of 200 nm that has been formed, by sputtering, from a material (a metallic material such as Cr and Mo) capable of absorbing and converting a laser light into heat, for example.

The transfer layer 6X is a material for the light-emitting layer 6. The transfer layer 6X is a layer formed by adding an organic material of a predetermined luminescent color described above (fluorescent material) to a xylene solution with a concentration of 1.0 wt/V %, dropping the solution on a surface of the photothermal conversion layer 22 based on a well-known spin coat method, and drying the dropped solution. The thickness of the transfer layer 6X is adjustable to approximately 40 nm to 60 nm. Instead of the spin coat method, the transfer layer 6X may be formed by a well-known inkjet method, die coat method, and other evaporation methods.

In the process of forming the light-emitting layer, the donor substrate 20 having the above-mentioned structure is disposed on the substrate on which the bank 5 has been formed. The glass substrate 20 is irradiated with a laser from a position corresponding to a region between the adjacent banks 5. The photothermal conversion layer 22 is heated only in a portion corresponding to the laser-irradiated portion, and the heated portion of the photothermal conversion layer 22 sublimates and transfers a corresponding portion of the transfer layer 6X onto the recess 4a formed in the hole injection layer 4. The light-emitting layer 6 is formed in the above-mentioned manner. By sequentially performing the process of forming the light-emitting layer by the laser transfer method as described above using the donor substrate 20 including the transfer layer 6X of each of RGB colors, the light-emitting layer 6 of each of the RGB colors is formed.

(Laser Transfer Method)

The laser transfer method has recently been drawing attention as an effective method to achieve miniaturization of a light-emitter and a large screen display in an organic EL display and the like (see Patent Literature 2, for example). The laser transfer method is a practical method, as it also has advantages that a donor substrate including a transfer layer of a predetermined luminescent color is preparable in advance and a film can be formed on a large-sized substrate in air without using a large-sized vacuum device (chamber) as used in the vacuum evaporation method.

The present inventor aims to improve a luminescence property by applying a metal compound to a charge injection layer of an organic EL element. As a result of an intense study on these points, the present inventor gained the following knowledge.

In the laser transfer method, the donor substrate 20 is generally partially irradiated with a laser so that a portion of the transfer layer 6X corresponding to an area defined by the adjacent banks 5 is sublimated and transferred to form the light-emitting layer 6. In the course of the process, the laser transfer method has the following problems.

[Problem of Void and Transfer Diffusion]

Figure 8A:
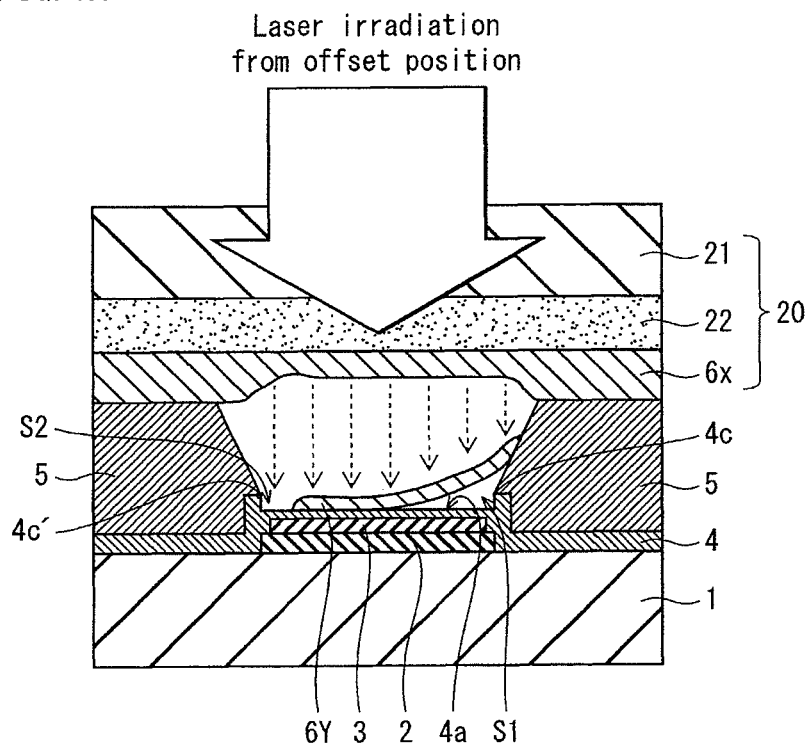
FIGS. 8A and 8B respectively illustrate a problem occurring in the process of forming the light-emitting layer by the laser transfer method, and an effect of the embodiment of the present disclosure.

Since the laser transfer method is an evaporation method utilizing sublimation of an organic material in principle, if a relatively angled portion or the like exists on a surface targeted for the transfer, a sublimated material is less likely to reach deep into the angled portion, compared to a case where a liquid material is used. Accordingly, as shown in FIG. 8A, there has been a problem that the light-emitting layer 6Y can be formed apart from a portion around the angled portion (in this example, a periphery of the recess formed in the hole injection layer 4), and a void S1 can be formed between the light-emitting layer 6Y and the hole injection layer 4. The void S1 as described above can increase in volume, for example, when an organic EL display is driven in the subsequent manufacturing process or after completion, or when temperature of a storage environment raises. The increase in volume of the void S1 can reduce adhesion between the light-emitting layer 6 and the hole injection layer 4, resulting in a reduction of a luminescence property of the organic EL display as a whole. Even if the void S1 is not formed, a material for the transfer layer sublimated in the laser transfer can diffuse in an unintended direction, and, due to a reduction of an amount of accumulated luminescent material, the light-emitting layer 6Y having a predetermined thickness cannot be formed, if laser irradiation is performed from an offset position (a problem of transfer diffusion). In this case, a problem similar to that arises in a case where the void 51 is formed arises.

[Problem of Exposure of Hole Injection Layer]

When laser irradiation via the donor substrate 20 is performed from a position offset from a position corresponding to a target position on the substrate on which the bank 5 has been formed, the light-emitting layer 6Y, which is primarily to be formed on the hole injection layer 4, is also formed in an offset position as shown in FIG. 8A. In this case, the light-emitting layer 6Y can concentrate in only one of the adjacent banks 5 or a part of the bank 5 (in a position close to the upper peripheral edge 4c of the recess in FIG. 8A), and a surface of the hole injection layer 4 can be partially exposed in a region S2 (in a position close to an upper peripheral edge 4c' of the recess in FIG. 8A). The partially exposed region S2 can cause uneven luminance in an organic EL element after completion of an organic EL display. Furthermore, if localized flow of current occurs in the partially exposed region S2 (in the vicinity of the upper peripheral edge 4c' of the recess), current does not flow at all in the vicinity of the upper peripheral edge 4c on the opposite side of the upper peripheral edge 4c'. In this case, similar to the partially exposed region S2, a part of the light-emitting layer 6Y formed in the vicinity of the upper peripheral edge 4c is a non-light-emitting region. This significantly affects an image-display performance.

Furthermore, when the second electrode (cathode) 8 alone, or a combination of an electron transport layer 7 formed from a low-resistance material and the second electrode 8 is formed on the light-emitting layer 6Y, the hole injection layer 4 and the second electrode 8, or the hole injection layer 4 and the electron transport layer 7 are directly connected to each other in the vicinity of the partially exposed region S2. This can result in a short-circuit, and cause a problem that the organic EL element does not emit light as a whole.

Advantages of Present Embodiment

To address the above-mentioned problems, in the organic EL display 100 according to the present embodiment, upper peripheral edges 4c and 4c' of the recess 4a formed in the hole injection layer 4 are each covered with a part of the bank 5 (the covering part 5d). By providing the covering part 5d, the light-emitting layer 6 is disposed without being in contact with the edges 4c and 4c'. There is no relatively angled portion, which is attributable to the upper peripheral edges 4c and 4c' of the recess, in a region to which the light-emitting layer is to be formed, it is possible to prevent formation of the void S1 and to densely form the light-emitting layer 6 having a uniform thickness. As a result, it is possible to maintain a laminate structure which is stable to a change in temperature environment in a process after the process of forming the light-emitting layer, at the time of driving a light-emitter, or during storage. Especially at the time of driving the organic EL display 100 after completion, the electrical field concentration in the vicinity of the upper peripheral edges 4c and 4c' of the recess 4a is suppressed, and, as a result, localized flow of current to the light-emitting layer 6 is suppressed. An occurrence of uneven luminance in a light-emitting surface is therefore suppressed, and the luminescence property is expected to be further improved.

Figure 8B:
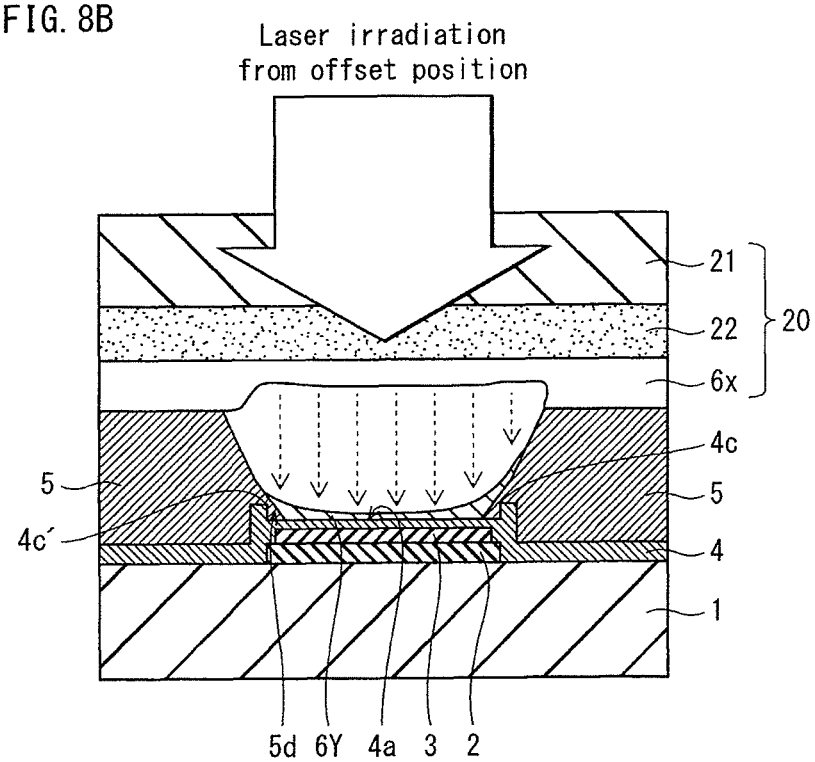

In addition, by forming the covering part 5d, a tolerance for an offset amount from a laser irradiation position corresponding to a target position on the substrate on which the bank 5 has been formed is increased by a length of a bottom surface of the covering part 5d. With this structure, as shown in FIG. 8B, even if the glass substrate of the donor substrate 20 is irradiated with a laser from an offset position, it is possible to appropriately form the light-emitting layer 6Y to some extent. As described above, an accuracy range of the laser irradiation position is expanded, and manufacturing efficiency is expected to be improved. It is desirable that the thickness of the covering part 5d (a shortest distance between the upper peripheral edge 4c of the recess 4a and the light-emitting layer 6) be 2 nm to 5 nm. In addition, it is desirable that the length of the bottom surface of the covering part 5d be 2 nm to 1 μm. According to the length of the bottom surface of the covering part 5d, an accuracy range of the laser irradiation position is expanded.

As described above, since it is unnecessary to adhesively form the transfer layer 6X on a surface portion of the hole injection layer 4 covered with the covering part 5d, an area on the hole injection layer 4 in which the light-emitting layer is to be formed is efficiently reduced. The transfer layer 6X sublimated by the laser irradiation is therefore accumulated primarily in the area (FIG. 8B). This produces effects that the transfer diffusion is prevented, and the light-emitting layer 6Y having a sufficient thickness is formed appropriately.

A process subsequent to the process of forming the light-emitting layer is described next.

Figure 9A:
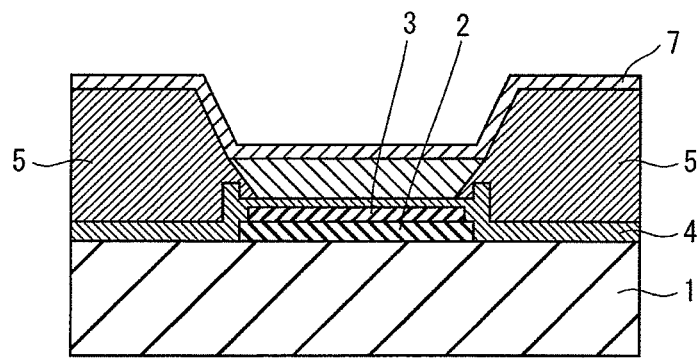
FIGS. 9A, 9B, and 9C are each a process chart showing a method for manufacturing the organic EL display according to the embodiment of the present disclosure.
Figure 9B:
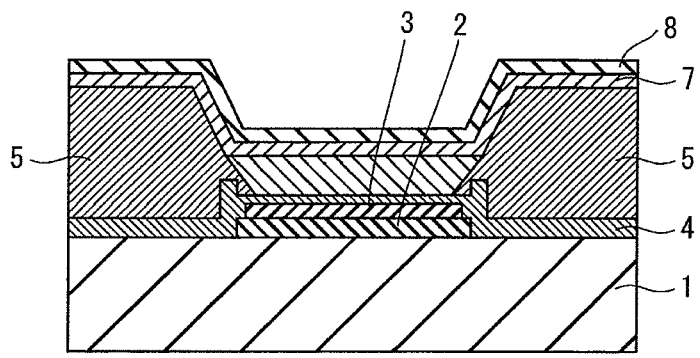
Figure 9C:
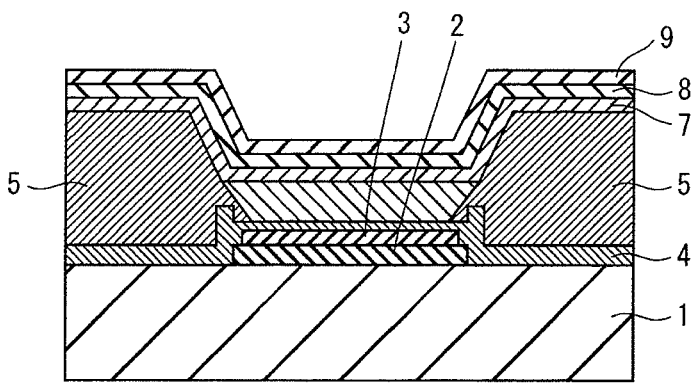

Next, as shown in FIG. 9A, a thin barium film as the electron injection layer 7 is formed using a vacuum evaporation method or the like. Then, as shown in FIG. 9B, a thin ITO film as the second electrode 8 is formed using a sputtering method. As shown in FIG. 9C, the passivation layer 9 is further formed.

According to the above manufacturing method, even when the recess 4a is formed in the exposed portion of the hole injection layer 4 during manufacturing, the electrical field concentration in the vicinity of the upper peripheral edge 4c of the recess is suppressed because the upper peripheral edge 4c of the recess is covered with the covering part 5d, and the light-emitting layer 6 is formed on the covering part 5d.

Furthermore, according to the above manufacturing method, after the thin film 11 having a uniform thickness is formed, a surface of the thin film 11 is partially dissolved to form a recess when bank residues are removed by being washed using the developer. As a result, the hole injection layer 4 having a reduced thickness in a light-emitting area is formed. In an actual process of forming a film, productivity is maintained relatively constant when a thick film is once formed and a thickness of the film is then adjusted, compared to a case where a thin film is formed in the first place.

In the process of forming a film, in order to form an extremely thin film, it is generally necessary to form the film in a relatively short time period. The thin film thus formed, however, is not stable in thickness, quality, and the like, and is likely to vary in thickness, quality, and the like. This is because the formation is performed even when a condition for the formation is not yet stabilized (in a sputtering method, until a plasma is generated in a chamber by discharge, and a plasma state is stabilized), and thus a thickness of an unstable portion of a film formed during the time period accounts for a large proportion of the overall thickness of the film. In contrast, according to the above manufacturing method, a thin film 11 having a certain thickness is first formed, and then a surface of the thin film 11 is partially dissolved to form a recess. The above manufacturing method is therefore advantageous because the hole injection layer 4 having a good charge injection transport property and having a reduced thickness in a light-emitting area is efficiently produced.

<Other Matters>

Although having been explained based on the above embodiment, the present disclosure is not limited to the above embodiment. For example, the following modifications can also be implemented.

(1) In the above embodiment, $WO_x$ or $Mo_xW_yO_z$ is used as a material for the hole injection layer 4. In general, however, a metal oxide, a metal nitride, and a metal oxynitride are likely to be eroded by pure water. Therefore, even when a metal other than Mo (molybdenum) and W (tungsten) is used as a material for the hole injection layer 4, a similar effect is obtained by applying the present embodiment.

(2) In the above embodiment, the recess is formed by the hole injection layer being eroded by pure water during washing. However, an effect of suppressing the electrical field concentration in the vicinity of the upper peripheral edge of the recess is obtained even when the recess is formed in another manner, by applying the present disclosure. For example, the recess may be formed by the hole injection layer being eroded by an etching solution during etching, or by the hole injection layer being eroded by a release agent during removal of the resist pattern. As described above, the present disclosure is effective in a case where the hole injection layer is made from a material that is eroded when exposed to a liquid used for forming the bank, in particular, the hole injection layer is made from a material that is eroded when exposed to a liquid used while the hole injection layer is partially exposed.

Figure 10:
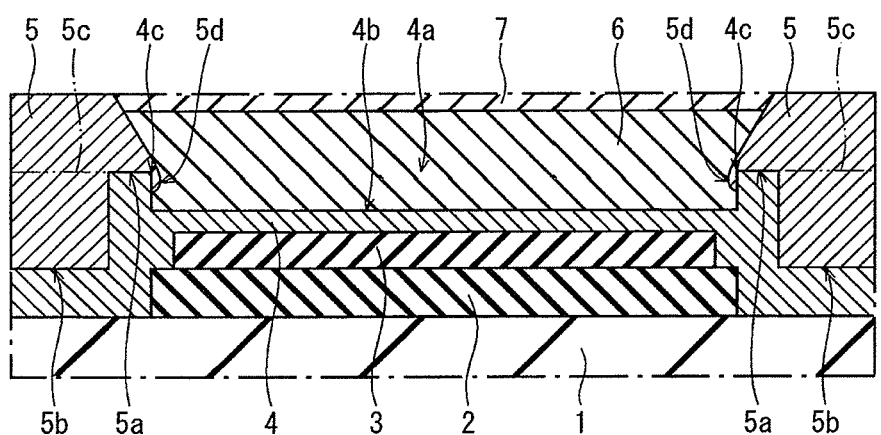
FIG. 10 is an end elevation schematically showing a cross section of a part of an organic EL display according to a modification of the present disclosure.

(3) In the above embodiment, the covering part extending from the bank reaches the bottom 4b of the recess beyond the upper peripheral edge 4c of the recess. However, the present disclosure is not limited to the above as long as at least the upper peripheral edge 4c of the recess is covered. For example, as shown in FIG. 10, the covering part 5d may be out of contact with the bottom 4b of the recess. When the structure shown in FIG. 10 is adopted, the temperature and time of the heat treatment are reduced, as it is not necessary to extend the bank material to the bottom of the recess.

In the above embodiment, the recess 4a is formed in the hole injection layer 4 by the development in the process of forming the bank. In the present disclosure, however, mask pattering or the like may be used as a method for forming the recess.

Figure 11A:
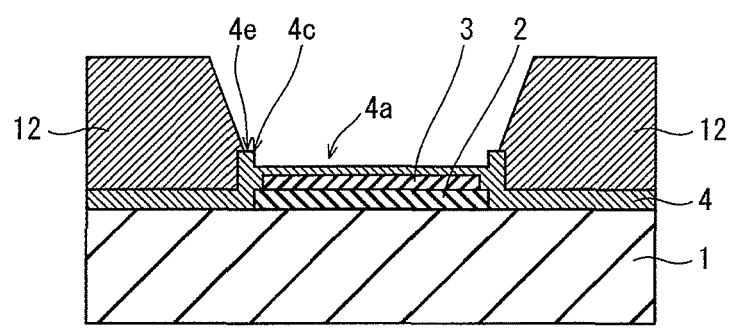
FIGS. 11A and 11B are each a process chart showing a method for manufacturing the organic EL display according to a modification of the present disclosure.
Figure 11B:
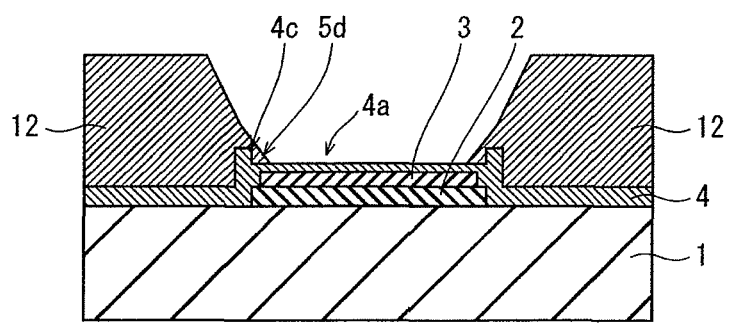

(4) In FIG. 6A, although a lower end of the slope of the bank material 12 coincides with the upper peripheral edge 4c of the recess, the structure of the bank material 12 is not limited to this. Depending on the bank material, the part of the upper surface of the hole injection layer 4 in which the recess is not formed 4e may be partially exposed by the slope of the bank material 12 being set back, as shown in FIG. 11A. In such a case, by appropriately heat treating the bank material 12, the upper peripheral edge 4c of the recess is covered with a part of the bank material (see FIG. 11B).

Figure 12:
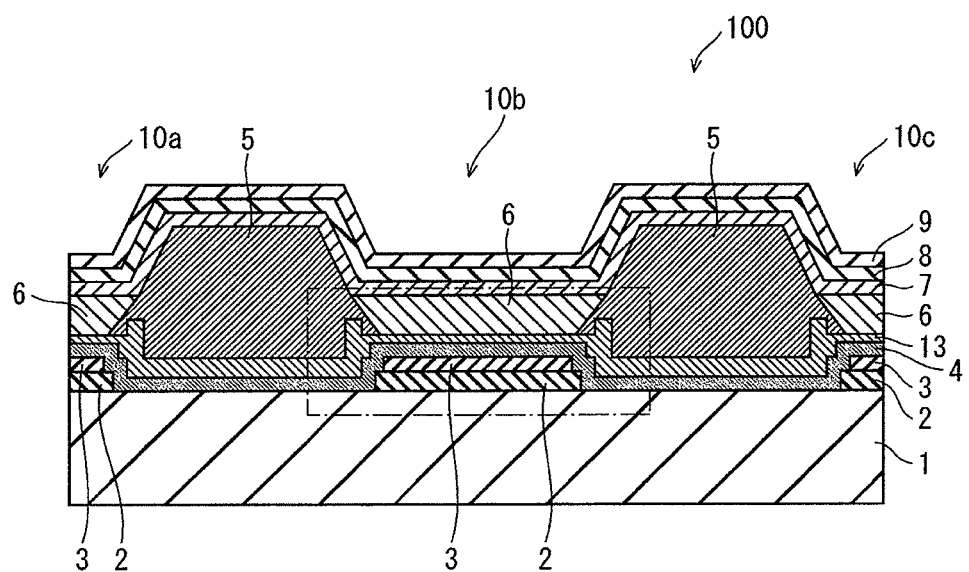
FIG. 12 is an end elevation schematically showing a cross section of a part of an organic EL display according to a modification of the present disclosure.

(5) In the above embodiment, as the charge injection transport layer, only the hole injection layer 4 is interposed between the first electrode and the light-emitting layer. The present disclosure, however, is not limited to the above. For example, as shown in FIG. 12, a hole transport layer 13 may be formed on the hole injection layer 4, and these layers may be interposed as the charge injection transport layer. In this case, the recess is formed in an upper surface of the hole transport layer 13, and an upper peripheral edge of the recess formed in the hole transport layer 13 is covered with the covering part.

Figure 14:
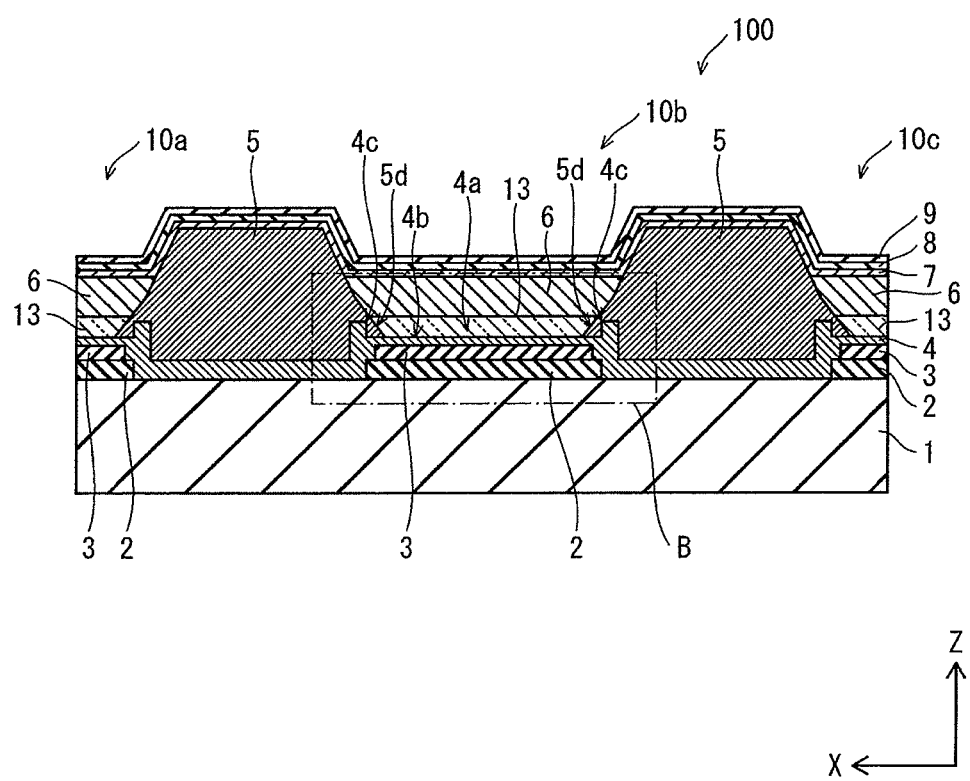
FIG. 14 is an end elevation showing a part of an organic EL display according to a modification of the present disclosure.

Furthermore, the charge injection transport layer may be constituted only from a hole injection layer, and the hole injection layer and a hole transport layer constituting a functional layer may be interposed between the first electrode and the light-emitting layer. Specifically, as shown in a portion B in FIG. 14, the hole transport layer 13 may be formed by applying ink including a hole transport material to the recess 4a formed in the hole injection layer 4 in a state where the upper peripheral edge 4c of the recess 4a formed in the hole injection layer 4 is covered with the covering part 5d of the bank 5, and the light-emitting layer 6 may be formed by applying ink including a luminescent material to the hole transport layer 13.

(6) In the above embodiment, since the first electrode 2 is formed from the thin Ag film, the ITO layer 3 is formed on the first electrode 2. When the first electrode 2 is formed from an Al-based material, it is possible to adopt a single layer structure of the anode without forming the ITO layer 3.

(7) In the above embodiment, although the organic EL display is taken as an example of the light-emitting device having a plurality of light-emitters, the present disclosure is not limited to this. The present disclosure may be applied to a luminaire and the like.

Figure 13:
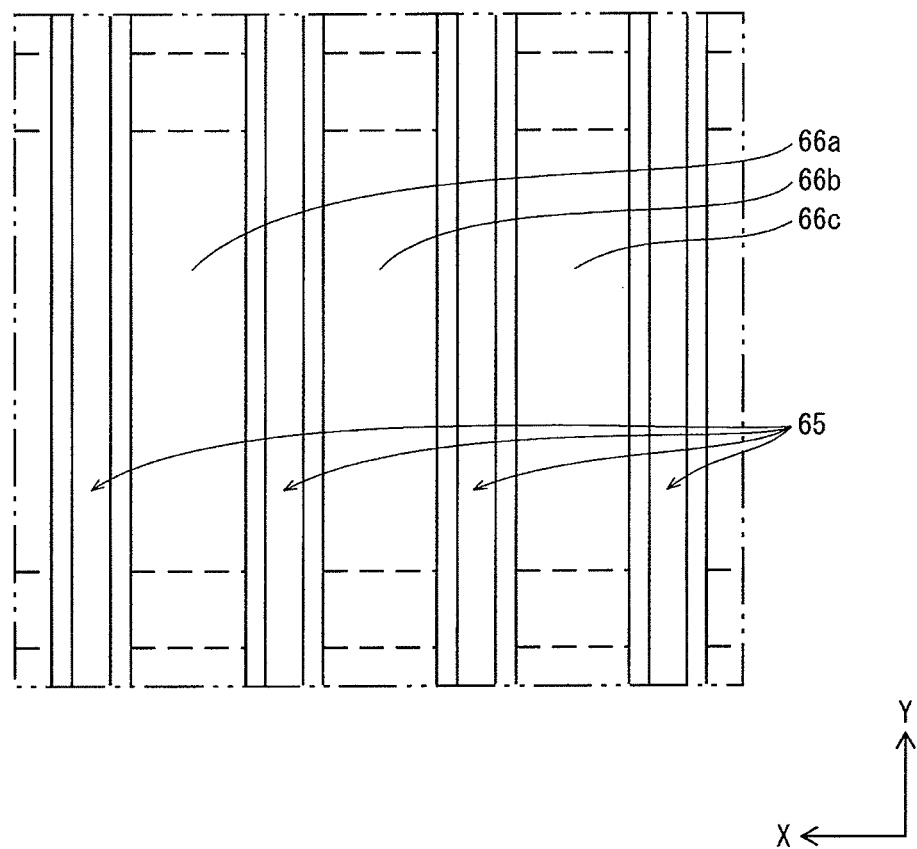
FIG. 13 is a plan view showing a part of an organic EL display according to a modification of the present disclosure.

(8) In the above embodiment, although the so-called pixel bank (a bank having a lattice shape) is adopted, the present disclosure is not limited to this. For example, a line bank (banks arranged in lines) may be adopted. In an example of FIG. 13, the line bank 65 is adopted. The line bank 65 delimits consecutive light-emitting layers 66a, 66b, and 66c arranged along the X axis. Note that when the line bank 65 is adopted as shown in FIG. 13, adjacent light-emitting layers arranged along the Y axis are not defined by the bank element. However, by appropriately determining a driving method, a size of the anode, an interval between the anodes and so on, the adjacent light-emitting layers emit light without influencing each other.

(9) In the above embodiment, although a top-emission type light-emitter is adopted, the light-emitter of the present disclosure is not limited to the top-emission type light-emitter. A bottom-emission type light-emitter may be adopted.

(10) In the above embodiment, although only the electron injection layer is interposed between the light-emitting layer and the second electrode, the electron transport layer may be interposed in addition to the electron injection layer.

(11) In the above embodiment, although an organic material is used as a bank material, an inorganic material may be used instead.

In this case, similarly to a case where an organic material is used, the bank material layer is formed by application or the like. A portion of the bank material layer is removed by forming a resist pattern on the bank material layer, and then performing etching using a predetermined etching solution (e.g. a tetramethylammonium hydroxide (TMAH) solution). The resist pattern is removed by an aqueous or non-aqueous release agent after the etching. Next, residues remaining after the etching are removed by being washed with pure water. Since WOx or MoxWyOz, which is a material for the thin film, is soluble in pure water and a TMAH solution, as shown in FIG. 6A, an exposed portion of the thin film is eroded, and a recess is formed. As a result, the hole injection layer having the recess is formed. As described above, the present disclosure is applicable to a case where, instead of an organic material, an inorganic material is used as a material for the bank material.

INDUSTRIAL APPLICABILITY

The present disclosure is applicable to an organic EL display and the like.

REFERENCE SIGNS LIST

1 TFT substrate
2 first electrode
3 ITO layer
4 hole injection layer
4a recess
4b bottom of recess
4c, 4c' upper peripheral edge of recess
4d inner side surface of recess
4e part of upper surface of hole injection layer in which recess is not formed
5 bank
5a, 5b bottom surface of bank
5c level of bottom surface of bank
5d covering part
6, 6Y light-emitting layer
6X transfer layer
7 electron injection layer
8 second electrode
9 passivation layer
10a, 10b, 10c organic EL element
11 thin film
12 bank material layer
13 hole transport layer
20 donor substrate (transfer substrate)
21 glass substrate
22 photothermal conversion layer
55 pixel bank
55a bank element
55b bank element
56a1, 56a2, 56b1, 56b2, 56c1, 56c2 light-emitting layer
65 line bank
66a, 66b, 66c light-emitting layer
100 organic EL display

The invention claimed is:

1. A method for manufacturing a light-emitter including a first electrode, a laminate disposed on the first electrode that includes a charge injection transport layer and a light-emitting layer, a second electrode disposed on the laminate, and a bank that defines an area in which the light-emitting layer is to be formed, the method comprising:
    forming the charge injection transport layer;
    forming a bank material layer that forms the bank on the charge injection transport layer;
    removing a portion of the bank material layer to partially expose the charge injection transport layer;
    heat-treating a remaining portion of the bank material layer; and
    forming the light-emitting layer on an exposed surface of the charge injection transport layer after the heat treatment, wherein
    the charge injection transport layer is made from a material that is eroded when exposed to a liquid used while the charge injection transport layer is partially exposed, the charge injection transport layer having a recess in the exposed surface thereof so that a bottom of the recess is lower than a bottom surface of the remaining portion of the bank material layer, the recess being formed by the exposed surface eroded by the liquid, the remaining portion of the bank material layer being made fluid so that the bank material layer extends to cover an upper peripheral edge of the recess, the light-emitting layer being formed by using a laser transfer method.

2. The method for manufacturing the light-emitter of claim 1, wherein the charge injection transport layer is a hole injection layer made from one of a metal oxide, a metal nitride, and a metal oxynitride.

3. The method for manufacturing the light-emitter of claim 2, wherein a hole transport layer that transports holes from the hole injection layer to the light-emitting layer is interposed between the hole injection layer and the light-emitting layer.

4. The method for manufacturing the light-emitter of claim 1, wherein the charge injection transport layer is made from a material that is eroded when exposed to a liquid used for forming the bank.

5. The method for manufacturing the light-emitter of claim 4, wherein the liquid is water or a TMAH solution.

6. The method for manufacturing the light-emitter of claim 1, wherein the bank is formed so that a part of the bank reaches a bottom of the recess and that a side surface of the bank slopes upward from the bottom of the recess to a top of the bank.

7. The method for manufacturing the light-emitter of claim 1, wherein the bank is formed so that a part of the bank is out of contact with a bottom of the recess.

8. The method for manufacturing the light-emitter of claim 1, wherein the bank is formed so as to include an insulating material.

9. The method for manufacturing the light-emitter of claim 1, wherein the light-emitting layer comprises an organic EL layer.

10. The method for manufacturing the light-emitter of claim 1, wherein the charge injection transport layer is formed so as to extend laterally along a bottom surface of the bank.

11. The method for manufacturing the light-emitter of claim 1, wherein the upper peripheral edge of the recess is formed so as to comprise a convex portion composed of (i) a part of the upper surface of the charge injection transport layer in which the recess is not formed, and (ii) an inner side surface of the recess.

12. The method for manufacturing the light-emitter of claim 1, wherein, in the forming the light-emitting layer, for each of a plurality of areas defined by the bank, a transfer substrate having a transfer layer of a corresponding color is irradiated with a laser to sublimate and transfer the transfer layer onto the charge injection transport layer, thereby forming a plurality of light-emitting layers of different colors.

13. The method for manufacturing the light-emitter of claim 12, wherein the forming the light-emitting layer includes the successive steps of:

irradiating, with a laser, a first transfer substrate including a photothermal conversion layer and a first transfer layer of a first luminescent color laminated on the photothermal conversion layer, to sublimate and transfer the first transfer layer, thereby forming the light-emitting layer of the first luminescent color, and irradiating, with a laser, a second transfer substrate including the photothermal conversion layer and a second transfer layer of a second luminescent color laminated on the photothermal conversion layer, to sublimate and transfer the second transfer layer, thereby forming the light-emitting layer of the second luminescent color.

* * * * *